United States Patent [19]

Morales et al.

[11] Patent Number: 6,100,192

[45] Date of Patent: Aug. 8, 2000

[54] METHOD OF FORMING HIGH INTEGRITY TUNGSTEN SILICIDE THIN FILMS

[75] Inventors: Guarionex Morales, Santa Clara; Richard J. Huang, Cupertino, both of Calif.

[73] Assignee: Advanced Micro Devices, Inc., Sunnyvale, Calif.

[21] Appl. No.: 08/993,892

[22] Filed: Dec. 18, 1997

[51] Int. Cl.⁷ ..................................... H01L 21/44
[52] U.S. Cl. .......................... 438/682; 438/655; 438/657; 438/680; 438/674
[58] Field of Search ..................... 438/682, 680, 438/681, 791, 655, 657, 674

[56] References Cited

U.S. PATENT DOCUMENTS

| | | | |
|---|---|---|---|
| 5,618,755 | 4/1997 | Ito | 438/592 |
| 5,635,765 | 6/1997 | Larson | 257/768 |
| 5,643,633 | 7/1997 | Telford et al. | 427/255 |
| 5,795,827 | 8/1998 | Liaw et al. | 438/663 |
| 5,963,836 | 10/1999 | Kang et al. | 438/682 |
| 5,981,387 | 11/1999 | Yeo et al. | 438/682 |

*Primary Examiner*—Caridad Everhart

[57] ABSTRACT

Thin films of tungsten silicide are deposited by CVD on conductive lines under conditions controlled to minimize development of tensile stresses upon subsequent thermal processing, thereby reducing cracking and delamination. Embodiments include reducing the deposition temperature and/or adjusting the gas flow ratio of reactants, such that the as deposited tungsten silicide film does not undergo a significant increase in densification and/or crystallinity upon subsequent deposition of a polycrystalline silicon capping layer.

21 Claims, No Drawings

METHOD OF FORMING HIGH INTEGRITY TUNGSTEN SILICIDE THIN FILMS

TECHNICAL FIELD

The present invention relates to a method of manufacturing a semiconductor device comprising capped metal silicide films. The invention has particular applicability in manufacturing ultra-large scale integration and high density flash memory semiconductor devices with submicron design features.

BACKGROUND ART

The escalating requirements for high densification and performance associated with ultra-large scale integration semiconductor devices requires design features of less than about 0.32 microns, including 0.30 microns and under, e.g., 0.25 microns and under, increased transistor and circuit speeds, high reliability and increased manufacturing throughput for competitiveness. The reduction of design features to 0.32 microns and under generates numerous problems challenging the limitations of conventional semiconductor manufacturing technology. Moreover, as design features are reduced below 0.32 microns, processing effects which were either not apparent or of little impact on device performance become apparent and/or adversely impact device performance, thereby generating an unacceptable rejection rate.

For example, it was found that in manufacturing flash memory devices, deposited metal silicide films, such as tungsten silicide, exhibit discontinuities, crevices and/or experience lifting or delamination during subsequent thermal processing. Such defects were not apparent and/or significant until the design rule reached submicron dimensions, such as less than about 0.32 microns.

Conventional methodology in manufacturing flash memory semiconductor devices comprises depositing, as by chemical vapor deposition (CVD), a metal silicide film, such as a tungsten silicide film, on a conductive layer, such as polycrystalline silicon, e.g., a word line. The tungsten silicide layer is conventionally deposited at a temperature of about 360° C., has an as deposited silicon/tungsten ratio of about 2.6–2.7 and is substantially amorphous. Subsequently, a capping layer is deposited at a temperature greater than that employed for CVD of the tungsten silicide film. For example, conventional methodology in manufacturing flash NOR semiconductor devices comprises depositing a polycrystalline silicon capping layer at a temperature of about 600° C. Conventional methodology for manufacturing flash NAND semiconductor devices comprises depositing a silicon nitride capping layer at a temperature of about 400° C. Such capping layers are conventionally deposited on a tungsten silicide film to maintain the stability of the tungsten silicide film in place and to provide a source of silicon for saturation of the tungsten silicide film, thereby enhancing etch selectivity.

As the design rule shrinks to 0.32 microns and under, discontinuities, such as crevices in and/or lifting of the deposited tungsten silicide films occurred. These defects were not previously apparent and/or did not previously adversely affect device performance until processing device features with submicron dimensions, e.g., a tungsten silicide film having a thickness of about 0.32 microns and under.

Accordingly, there exists a need for semiconductor technology which enables the manufacture of flash memory devices with submicron features, particularly features below 0.32 microns, comprising capped metal silicide films on conductive layers, such as capped tungsten silicide films, exhibiting high reliability.

DISCLOSURE OF THE INVENTION

An object of the present invention a method of manufacturing a flash memory semiconductor device having submicron features, including capped metal silicide films on a conductive layer, with high integrity.

Additional objects, advantages and other features of the invention will be set forth in part in the description which follows and in part will become apparent to those having ordinary skill in the art upon examination of the following or may be learned from the practice of the invention. The objects and advantages of the invention may be utilized and obtained as particularly pointed out in the appended claims.

According to the present invention, the foregoing and other objects are achieved in part by a method of manufacturing a semiconductor device, which method comprises: forming a conductive layer on an insulating layer; depositing, by chemical vapor deposition employing gaseous reactants, a metal silicide film on the conductive layer, and controlling one or more deposition conditions such that the as deposited metal silicide film has a sufficiently high density to substantially avoid the formation of crevices upon subsequent deposition of a capping layer on the deposited metal silicide film.

Another aspect of the present invention is a method of manufacturing a semiconductor device, which method comprises: forming a conductive layer on a semiconductor substrate with an insulating layer therebetween; depositing, by chemical vapor deposition, a metal silicide film on the conductive layer; and depositing a capping layer of silicon nitride on the metal silicide film by chemical vapor deposition at a temperature less than about 400° C.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the description is to be regarded as illustrative in nature, and not as restrictive.

DESCRIPTION OF THE INVENTION

As the design rule progresses into the submicron range, such as 0.32 microns and under, particularly below 0.30 microns and under, defects generated by conventional methodology become apparent and/or adversely impacted device performance. It was found that in manufacturing flash memory semiconductor devices having a design rule less than about 0.32 microns, capped metal silicide films, particularly capped tungsten silicide films, formed on conductive layers, such as word lines, undergo crevice formation and lifting, thereby adversely affecting device performance by causing electrical discontinuities. After extensive experimentation and investigation, it was concluded that the discontinuities and/or lifting of tungsten silicide films resulted from increased tensile stress imposed on the tungsten silicide films due to an increase in densification and/or crystallinity of the as deposited films which, in turn, resulted from subsequent thermal processing, particularly the deposition of a capping layer at elevated temperatures, such as a polycrystalline silicon capping layer at a temperature of about 600° C. Conventional methodology comprises depositing the tungsten silicide film by CVD at a temperature of about 360° C., whereby the as deposited tungsten silicide film has a silicon/tungsten ratio of about 2.6 to about 2.7 and is substantially amorphous.

It is believed that during subsequent deposition of a polycrystalline silicon capping layer at a temperature of about 600° C., as when manufacturing a conventional flash NOR semiconductor device, an increase in densification gradually occurs imposing tensile stress on the characteristic CVD seam extending in a direction substantially perpendicular to the topography or contour of the deposited tungsten silicide film. In CVD deposited tungsten silicide films having a thickness of less than about 3.2 microns, it was found that such seam discontinuities generate unacceptable crevices and/or cause lifting of the capped tungsten silicide film, thereby adversely impacting device performance.

The present invention addresses and solves such reliability problems of capped metal silicide films, particularly capped tungsten silicide films, by strategically adjusting one or more CVD deposition conditions, thereby reducing the amount of increase in density and/or crystallinity of the as deposited tungsten silicide films upon subsequent processing, thereby avoiding detrimental formation of defects, such as crevice formation and/or lifting, which adversely impact device performance. In an embodiment of the present invention, this objective is achieved, particularly in the case of flash NOR technology, by depositing the metal silicide film, e.g., tungsten silicide, by a chemical vapor deposition employing gaseous reactants, and controlling one or more deposition conditions such that the as deposited metal silicide film has a sufficiently high density such that a subsequently deposited polycrystalline silicon capping layer thereon does not result in the creation of defects such as crevices and/or lifting of the deposited metal silicide film.

In embodiments of the present invention, a silicon oxide insulating layer is formed on a semiconductor substrate, a polycrystalline silicon layer is formed thereon and conventional photolithographic and etching techniques performed to pattern a wordline. A metal silicide, such as tungsten silicide, is then deposited employing gaseous reactants, typically silane and tungsten hexafluoride. Subsequently, a capping layer of polycrystalline silicon is deposited by chemical vapor deposition. In accordance with an aspect of such embodiments of the present invention, the temperature and/or ratio of gaseous reactants during CVD of the tungsten silicide film are controlled so that the as deposited tungsten silicide film exhibits a sufficiently high density to avoid the generation of detrimental defects upon subsequent processing, such as crevice formation and lifting.

The CVD conditions to obtain a sufficiently high density to avoid the generation of detrimental defects upon subsequent processing can be readily determined for a particular situation. For example, it was found that increasing the CVD temperature to about 490° C. to about 550° C., e.g., about 520° C. to about 550° C., resulted in an as deposited tungsten silicide film having a sufficiently high density to avoid defect formation upon subsequent deposition of a polycrystalline capping layer. Upon subsequent deposition of a capping layer of polycrystalline silicon at a temperature of about 600° C. by CVD, the degree to which the density of the as deposited tungsten silicide film increased was significantly reduced vis-a-vis conventional methodology involving CVD of the tungsten silicide film at about 360° C. Accordingly, the amount of tensile stress on the as deposited tungsten silicide film was also reduced, thereby avoiding or significantly reducing the generation of defects which adversely impact device performance, such as crevice formation and lifting.

In another embodiment of the present invention, the ratio of gaseous reactants, i.e., the gas flow ratio of silane and tungsten hexafluoride, is adjusted to reduce the amount of silicon in the as deposited tungsten silicide film. Conventionally deposited tungsten silicide films have a silicon/tungsten ratio of about 2.6 to about 2.7. In accordance with this embodiment of the present invention, the ratio of silane to tungsten hexafluoride during CVD is reduced, such that the silicon/tungsten ratio in the as deposited tungsten silicide film is reduced, e.g., to about 2.3 to about 2.5, thereby reducing the amount of tensile stress attendant upon an increase in the density of the as deposited tungsten silicide film upon subsequent processing vis-à-vis conventionally deposited tungsten silicide films.

Upon further experimentation and investigation, it was observed that the substantially amorphous as deposited tungsten silicide film undergoes an increase in crystallinity, characteristic of an increase in densification, upon subsequent thermal processing. In another embodiment of the present invention, one or more CVD conditions are controlled to increase the crystallinity of the as deposited tungsten silicide film. For example, the temperature during deposition of tungsten silicide is reduced and/or the ratio of gaseous reactants controlled such that the as deposited tungsten silicide film exhibits a powder X-ray diffraction pattern whereas, conventional CVD tungsten silicide films are substantially amorphous. For example, the gas flow ratio of silane to tungsten hexafluoride is adjusted to reduce the silicon tungsten ratio in the as deposited tungsten silicide film. In other embodiments of the present invention, the CVD deposition conditions are optimized with respect to both increased density and increased crystallinity of the as deposited tungsten silicide film, to minimize the generation of detrimental defects upon subsequent processing, thereby optimizing device reliability.

In another embodiment of the present invention relating to manufacturing flash NAND semiconductor devices, the increase in density of an as deposited CVD tungsten silicide film upon subsequent processing is reduced by reducing the temperature at which the silicon nitride capping layer is deposited on the tungsten silicide film. Conventional practices comprise depositing a silicon nitride capping layer on a tungsten silicide film at a temperature of about 400° C., resulting in detrimental defects upon subsequent processing due to the generation of significant tensile stress caused by increased densification and/or crystallinity. Such defects include unfilled crevices that extend through the tungsten silicide film. In accordance with this embodiment of the present invention, the CVD temperature during silicon nitride deposition is reduced below 400° C. For example, it was found that the deposition of a silicon nitride capping layer by CVD at a temperature of about 350° C. to about 380° C., reduced the degree of increased densification and/or crystallinity of the as deposited tungsten silicon film so that the amount of tensile stress subsequently developed did not generate defects, such as crevices and delamination, which adversely impacted device performance.

In accordance with the present invention, the amount of tensile stress generated in an as deposited metal silicide film by CVD, such as a tungsten silicide film, upon subsequent processing is reduced by reducing the degree of increased density and/or crystallinity, as caused by during deposition of a capping layer by CVD on the deposited tungsten silicide film, thereby reducing crevices and/or delamination and improving device performance. These objectives are achieved by controlling one or more deposition conditions to increase the density and/or crystallinity of the as deposited CVD tungsten silicide film, such as reducing the CVD temperature and/or adjusting the ratio of gaseous reactants. The temperature of the capping layer can also be reduced in order to reduce the stresses imposed on the as deposited tungsten silicide film.

The present invention may be practiced by employing conventional materials, methodology and equipment. Accordingly, the details of such materials, equipment and methodology are not set forth herein in detail. The present invention is applicable to the production of various types of semiconductor devices, particularly flash memory semiconductor devices, such as NOR devices and NAND devices, and enjoys particularly utility in the production of semiconductor devices having a design rule of less than about 0.32 microns, including less than about 0.30 microns, e.g., less than about 0.25 microns.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
    forming a conductive layer on an insulating layer;
    depositing, by chemical vapor deposition employing gaseous reactants, a metal silicide film directly on the conductive layer, and controlling one or more deposition conditions such that the as deposited metal silicide film has a sufficiently high density to substantially avoid the formation of crevices upon subsequent deposition of a capping layer; and
    depositing a polycrystalline silicon capping layer directly on the deposited metal silicide film.

2. The method according to claim 1, comprising depositing tungsten silicide as the metal silicide.

3. The metal according to claim 1, comprising forming the insulating layer on a semiconductor substrate.

4. The method according to claim 2, wherein the insulating layer comprises silicon oxide.

5. The method according to claim 4, wherein the polycrystalline silicon layer comprises a word line.

6. The method according to claim 2, comprising controlling the tungsten silicide chemical vapor deposition temperature and/or controlling the ratio of reactants during tungsten silicide chemical vapor deposition.

7. The method according to claim 6, comprising controlling the tungsten silicide chemical vapor deposition temperature below about 600° C.

8. The method according to claim 7, comprising controlling the tungsten silicide chemical vapor deposition temperature within a temperature range of about 490° C. to about 550° C.

9. The method according to claim 8, comprising controlling the tungsten silicide chemical vapor deposition temperature within a temperature range of about 520° C. to about 550° C.

10. The method according to claim 2, wherein the tungsten silicide film has a thickness less than about 0.32 microns.

11. The method according to claim 10, wherein the tungsten silicide film has a thickness less than about 0.30 microns.

12. A method of manufacturing a semiconductor device, which method comprises:
    forming a conductive layer consisting essentially of polycrystalline silicon on an insulating layer;
    depositing, by chemical vapor deposition employing silane and tungsten hexafluoride gaseous reactants, a tungsten silicide film directly on the conductive layer, and controlling the gas flow ratio of the reactants such that the as deposited tungsten silicide film has a silicon/tungsten ratio of less than about 2.6 to substantially avoid the formation of crevices upon subsequent deposition of a capping layer; and
    depositing a capping layer on the deposited tungsten silicide film.

13. The method according to claim 12, comprising controlling the gas flow ratio of the reactants such that the as deposited tungsten silicide film has a silicon/tungsten ratio of about 2.3 to about 2.5.

14. The method according to claim 12, wherein the capping layer comprises polycrystalline silicon.

15. A method of manufacturing a semiconductor device, which method comprises:
    forming a conductive layer consisting essentially of polycrystalline silicon on an insulating layer;
    depositing, by chemical vapor deposition employing gaseous reactants, a tungsten silicide film directly on the conductive layer, and controlling one or more deposition conditions such that the as deposited tungsten silicide film has a powder X-ray diffraction pattern and/or a silicon/tungsten ratio of about 2.3 to about 2.5 and a sufficiently high density to substantially avoid the formation of crevices upon subsequent deposition of a capping layer; and
    depositing a capping layer on the deposited tungsten silicide film.

16. A method of manufacturing a semiconductor device, which method comprises:
    forming a conductive layer consisting essentially of polycrystalline silicon on an insulating layer;
    depositing, by chemical vapor deposition employing gaseous reactants, a tungsten silicide film directly on the conductive layer, and controlling the tungsten silicide chemical vapor deposition temperature and/or controlling the ratio of reactants during chemical vapor deposition such that the as deposited tungsten silicide film exhibits a powder X-ray diffraction pattern and/or a silicon/tungsten ratio of about 2.3 to about 2.5 and a sufficiently high density to substantially avoid the formation of crevices upon subsequent deposition of a capping layer; and
    depositing a capping layer on the deposited tungsten silicide film.

17. A method of manufacturing a semiconductor device, which method comprises:
    forming a conductive layer consisting essentially of polycrystalline silicon on a semiconductor substrate with an insulating layer therebetween;
    depositing, by chemical vapor deposition, a metal silicide film on the conductive layer; and
    depositing a capping layer of silicon nitride on the as-deposited metal silicide film by chemical vapor deposition at a temperature less than about 400° C.

18. The method according to claim 17, wherein the metal silicide comprises tungsten silicide.

19. The method according to claim 18, comprising depositing the silicon nitride capping layer at a temperature of about 350° C. to about 380° C.

20. The method according to claim 15, wherein the capping layer comprises polycrystalline silicon.

21. The method according to claim 16, wherein the capping layer comprises polycrystalline silicon.

* * * * *